United States Patent
Liaw et al.

(10) Patent No.: US 6,605,230 B1
(45) Date of Patent: *Aug. 12, 2003

(54) SOLUTIONS AND PROCESSES FOR REMOVAL OF SIDEWALL RESIDUE AFTER DRY ETCHING

(75) Inventors: Ming-Chi Liaw, Hsin-chu (TW); Tien-Sheng Chao, Hsin-chu (TW); Tan-Fu Lei, Hsin-chu (TW)

(73) Assignee: Merck Patent GmbH, Darmstadt (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/155,181

(22) PCT Filed: Mar. 10, 1997

(86) PCT No.: PCT/EP97/01190

§ 371 (c)(1),
(2), (4) Date: Mar. 26, 1999

(87) PCT Pub. No.: WO97/36209

PCT Pub. Date: Oct. 2, 1997

(30) Foreign Application Priority Data

Mar. 22, 1996 (GB) .......................... 96104613

(51) Int. Cl.[7] .......................................... H01L 21/4757
(52) U.S. Cl. ........................ 216/104; 216/107; 216/109; 134/1.3; 134/3; 438/906
(58) Field of Search ............... 134/3, 1.3; 252/79.3; 216/104, 107, 109; 438/906

(56) References Cited

U.S. PATENT DOCUMENTS

| 3,839,111 A | | 10/1974 | Ham et al. .................... 156/8 |
|---|---|---|---|
| 4,370,173 A | * | 1/1983 | Dollman ........................ 134/3 |
| 4,524,125 A | * | 6/1985 | Huang ........................ 430/302 |
| 4,585,515 A | | 4/1986 | Maa ........................... 156/643 |

(List continued on next page.)

FOREIGN PATENT DOCUMENTS

| EP | 346668 | 12/1989 |
|---|---|---|
| EP | 618612 | 10/1994 |

OTHER PUBLICATIONS

Institute of Electrical Engineers, Inspection No. 5169464, S. Verhaverbeke et al., "Improved rinsing efficiency after SPM ($H_2SO_4$–$H_2O_2$) by adding HF IC surface cleaning", XP002035581.

Proceedings of the Second International Symposium On Ultra–Clean Processing of Silicon Surfaces (UCPSS '94), Bruges, Belgium, Sep. 19–21, 1994, pp. 201–204.

Institute of Electrical Engineers, Inspection No. 3071502, F. Tomaiuolo, "Tests for vitriolic re–etching by faster electron microscope (multilayer PWB fabrication)", XP002035582.

(List continued on next page.)

*Primary Examiner*—Shrive P. Beck
*Assistant Examiner*—Allan Olsen
(74) *Attorney, Agent, or Firm*—Millen, White, Zelano, Branigan, P.C.

(57) ABSTRACT

The present invention relates to a novel process for removing sidewall residue after dry-etching process. Conventionally, after dry-etching, photoresist and sidewall residues are removed by ozone ashing and hot sulfuric acid. Normally, they are hard to be removed completely. It was found in the present invention that the addition of fluorine-containing compound, preferably hydrogen fluoride and ammonium fluoride, in sulfuric acid results in complete removal of photoresist and sidewall residue without the need for stripper. The process is simple and does not affect the original procedures or the other films on the substrate. The present invention also relates to a novel solution for removing sidewall residue after dry-etching, which comprises sulfuric acid and a fluorine-containing compound, preferably hydrogen fluoride and ammonium fluoride, in the range of from 10:1 to 1000:1 by weight.

7 Claims, 2 Drawing Sheets

U.S. PATENT DOCUMENTS

| | | | |
|---|---|---|---|
| 5,292,402 A | | 3/1994 | Abt et al. ............... 156/659.1 |
| 5,294,570 A | | 3/1994 | Fleming et al. ............. 437/239 |
| 5,300,463 A | * | 4/1994 | Cathey et al. .............. 437/228 |
| 5,326,490 A | | 7/1994 | Mori et al. ................. 252/792 |
| 5,895,563 A | * | 4/1999 | Muranushi .................. 205/210 |

OTHER PUBLICATIONS

Finommechanika–Mikrotechnika, Apr.–May 1986, Hungary, vol. 25, No. 4–5, pp. 103–108.

Institute of Electrical Engineers, Inspection No. 5169485, L.P. Rotondaro, "Interaction of the sulphuric acid hydrogen peroxide mixture with silicon surfaces", XP00235583.

Derwent Publications Ltd., Section Ch Week 9719, AN 97–211592, XP002035585 & TW 296 405A (Merck–Kanto Advanced Chem Ltd.), Jan. 21, 1997.

* cited by examiner

Conventional removal PR=$O_3$+($H_2SO_4$+$H_2O_2$)

New removal PR=$O_3$+($H_2SO_4$+HF+$H_2O_2$)

SOLUTIONS AND PROCESSES FOR REMOVAL OF SIDEWALL RESIDUE AFTER DRY ETCHING

BACKGROUND OF THE INVENTION

1. Scope

The present invention relates to a novel process for removing sidewall residue after dry etching. The present invention also relates to a novel solution for removing sidewall residue after dry etching.

2. Current State of the Art

Processes of Integrated Circuit (IC) Manufacturing

First is deposited a layer of metal, such as Al, on a substrate surface, such as a wafer, then coating a layer of photoresist on it. This is followed by exposure, developing, etching, ion implantation and photoresist removing. Continuous cycles of film deposition, photoresist coating, exposure, developing, etching and removal of photoresist continue until the desired device is achieved.

There are two kinds of photoresist: positive type and negative type. For positive type photoresist, the area of exposure can be dissolved in developer solution. For negative type photoresist, the area of non-exposure can be dissolved in developer solution. The major composition of positive photoresist is resin, such as Novolac resin. The major composition of negative type photoresist is polyisoprene compound. Generally, baking the photoresist layer after exposure is necessary to make sure that cross-linking reaction is done.

After creating basic IC pattern and more sophisticated IC pattern is to be processed on the substrate, the photoresist and sidewall residue must be removed very efficiently and completely. That is by the use of a photoresist stripper, as in U.S. Pat. Nos. 4,917,122 and 4,963,342 described. In the etching process of VLSI (Very Large Scale Integrated) or ULSI (Ultra Large Scale Integrated) manufacturing, sidewall passivation formed after dry etching can achieve the anisotropic phenomena of etching process, as in J. L. Vossen, et al, J. Vac Sci. Technol. AL. 1453 (1983); J. H. Thomas, et al, Appl. Phys. Lett. 43, 859 (1983), D. Thomson, et al, Appl. Phys. Lett. 146, 1103 (1985), and J. M. E. Harper, et al, J. Electrochem. Soc. 128, 1077 (1981) described. While etching Poly-Si, according to the etching chemistry of $Cl_2$ or HBr, oxygen is added to enhance anisotropic tendency and selectivity to oxide layer, as in I. Morimoto et al, Digest of papers, Microprocess 202 (1992) described. While etching Poly-Si layer using $Cl_2$ as etching gas, silicon reacting with chlorine becomes silicon chloride. If oxygen exists, silicon chloride will be oxidized to silicon oxide, as in K. V. Guinn et al, J. Vac. Sci. Technol. B 13, 214 (1995) described. This silicon oxide is the so-called sidewall passivation, which can prevent isotropic etching. The sidewall passivation cannot be removed completely by conventional ozone ashing and hot sulfuric acid process. In the general process, wafers after treatment of ozone ashing and hot sulfuric acid still need to be immersed in diluted HF solution. The time of immersion cannot last too long to avoid attacking bottom oxide layer. Although the residue can be removed by special stripper, it is not convenient enough. Therefore the process of removing sidewall residue after dry etching should be improved.

SUMMARY OF THE INVENTION

The present invention relates to a novel solution in which a certain amount of fluorine-containing compound, preferably hydrogen fluoride and ammonium fluoride, is added into sulfuric acid. This solution can completely remove sidewall residue which is formed after dry etching.

The invention also relates to a novel process by which sidewall residue after dry etching can be completely removed by the above mentioned novel solution.

DETAILED DESCRIPTION OF THE INVENTION

Figure 1:
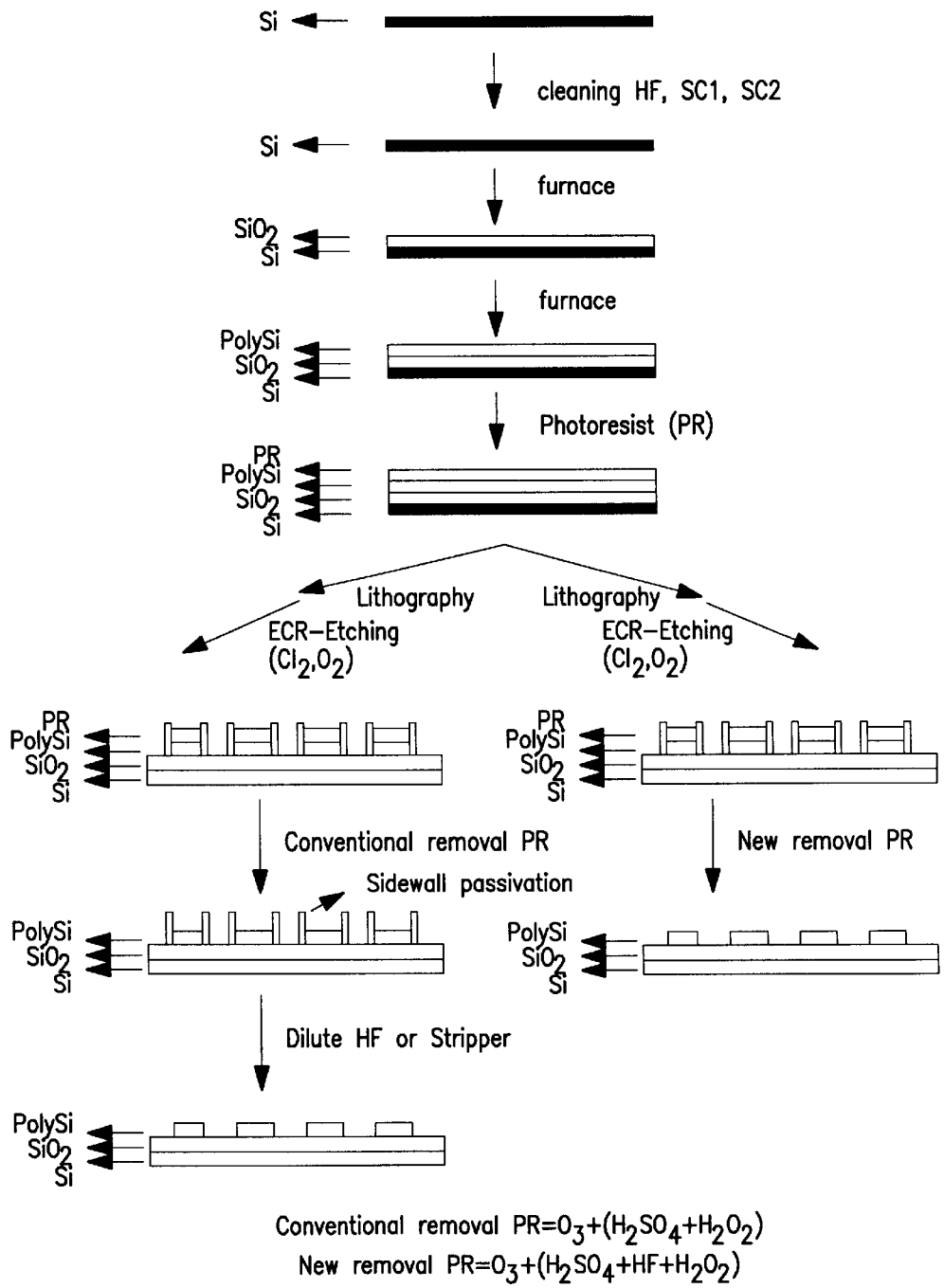
FIG. 1 shows the flow chart of the conventional and the novel process used in IC manufacturing process.

The processes of IC manufacturing can be described as follows. First of all, cleaning wafer surface, then depositing $SiO_2$ and Poly-Si films on it. After that, photoresist coating, exposure, developing, etching and photoresist stripping processes are done. FIG. 1 shows the flow chart of the process.

Figure 2:
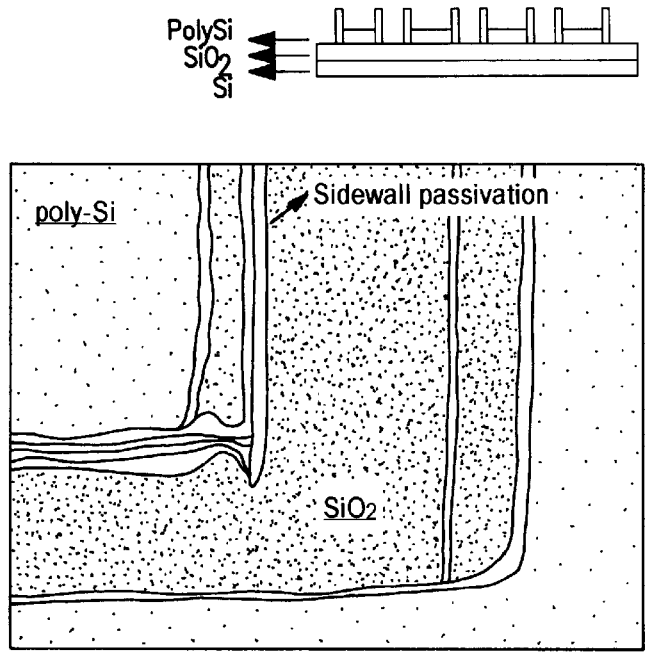
FIG. 2 shows the magnified picture of a wafer treated with the conventional process and the magnification is 13,100 times.

Conventionally photoresist and sidewall residue are removed by ozone ashing and hot sulfuric acid, but they cannot be removed completely (FIG. 2). Following immersion into diluted HF solution or special strippers is required.

Figure 3:
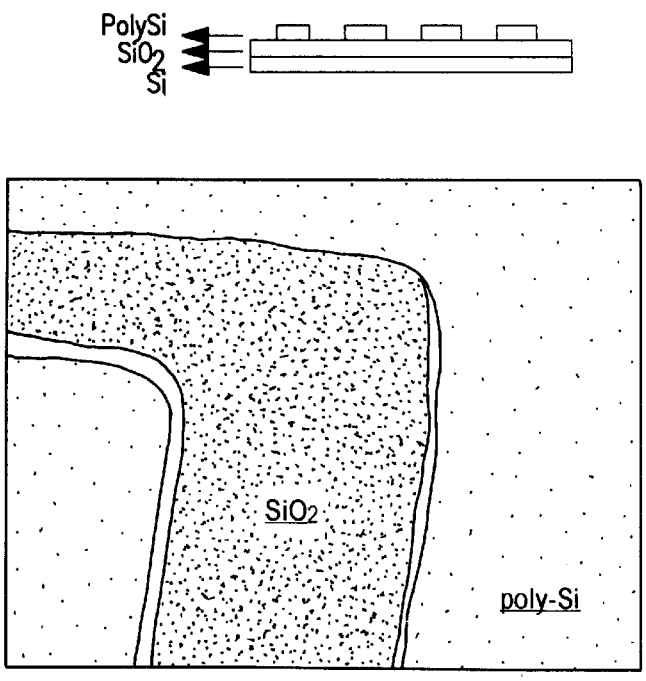
FIG. 3 shows the magnified picture of a wafer treated with the novel process and the magnification is 11,000 times.

The present invention is a process on which by addition of fluorine-containing compound into sulfuric acid, controlling the ratio of sulfuric acid to fluorine-containing compound, complete removal of sidewall residue without the need for diluted HF and special strippers can be achieved (FIG. 3). The process is simpler and can reduce process steps to only one. FIG. 1 shows the flow chart of the process.

The invention uses a novel solution to remove sidewall residue formed after dry etching, which comprises sulfuric acid and a fluorine-containing compound, in the range of from 10:1 to 1000:1 by weight, preferably in the range of from 100:1 to 700:1, most preferred in the range of from 300:1 to 500:1. The fluorine-containing compound is composed of fluorine ion and mono-charge cation, such as alkaline metal cation, ammonium cation and hydrogen ion, preferably hydrogen fluoride and ammonium fluoride. The novel solution is prepared by adding hydrofluoric acid or ammonium fluoride into sulfuric acid, and then mixing it with hydrogen peroxide at temperature 100–140° C., preferably 120° C. The above mentioned chemicals can be commercially available ones like $H_2SO_4$ 96%, $H_2O_2$ 31%, HF 49%, $NH_4F$ 40%.

While using the new process to remove sidewall residue after dry etching, both organic and inorganic, such as $SiO_2$, compounds can be removed. It can be implemented without increasing difficulty of the process. Just after dry etching and ozone ashing, put wafer into the pre-mixed solution of sulfuric acid and fluorine-containing compound, and maintaining operation pressure at 1 atm, temperature at 00–140° C. (preferably 120° C.) for 10 min. The photoresist and sidewall passivation formed after dry etching can be removed completely and the novel solution does not affect the film of poly-Si, and only slightly etching the bottom oxide layer (less than 1 Å/min). After dry-etching process, the wafer is put into the reaction chamber in which the ozone ashing process is done. During this process, ozone decomposes into oxygen and oxygen atoms which react with large amounts of carbon atoms in the photoresist under high temperature condition and then form $CO_2$. By detecting the amount of $CO_2$ one can know whether ozone ashing reaction completes or not.

The new process is simple, speedy, and does not need to use strippers or other solutions any more. Manufacturing cost for IC devices can be reduced significantly. Both feasibility and practicability of this new process are high. The process is suitable for several kinds of photoresists including g-line, i-line, Deep UV, E-beam and X-ray resists.

The following examples are further explanations of the invention. However, the scope of this invention is not limited to these examples. All possible substitutes and adjustments done by people who are familiar with this technique are belonging to the application and range of this invention.

EXAMPLE 1

The photoresist used in the process is FH-6400L g-line photoresist (Fuji-Hunt). Exposure is done by PAS 2500/10 g-line stepper (ASM). Developer used in the process is FHD-5 developer containing TMAH 2.38% (Fuji-Hunt). Developing time is 60 sec. The ECR (Electron Cyclotron Resonance) etching machine is used for etching 3000A of Poly-Si. The plasma is produced by using $Cl_2$ (95 sccm), $O_2$ (5 sccm) and 250 W microwave. DC Bias is provided by 35 W of RF. Pressure in the chamber is 3 mTorr while temperature is −20° C. Etching time is 70 sec. The etching rate for Poly-Si is 2612 Å/min for Poly-Si, 26 Å/min for SiO2, 766 Å/min for photoresist. As for selectivity, the ratio of Poly-Si to SiO2 (2612/26) is 100 while Poly-Si to photoresist (2612/766) is 3.4. (sccm—standard cubic centimeter per minute)

Comparative Example

After dry etching, conventional process is used to remove photoresist. At first, the photoresist is removed by ozone ashing which is done inside the chamber, one wafer per time at temperature of 200–300° C. At this temperature, decomposed oxygen from ozone reacts with the carbon of photoresist and forms $CO_2$. Then the wafer is immersed into mixed solution of sulfuric acid and hydrogen peroxide at 120° C. for 10 min. After this treatment, the wafer is inspected by SEM (FIG. 2). At this stage, only photoresist can be removed while sidewall passivation after dry etching cannot be removed completely. Diluted HF or special stripper is needed for further treatment.

EXAMPLE 2

After dry etching, present novel process is used to remove photoresist. At first, photoresist is removed by ozone ashing which is done in the same way as the comparative example. Then the wafer is immersed into mixed solution of sulfuric acid, hydrofluoric acid and hydrogen peroxide at 120° C. for 10 min. The ratio of sulfuric acid+hydrofluoric acid to hydrogen peroxide is 3:1 by volume. After this treatment, the wafer is inspected by SEM (FIG. 3). It is obvious that photoresist and sidewall passivation after dry etching are removed completely by this single step without affecting Poly-Si and bottom $SiO_2$ layer.

EXAMPLE 3

After dry etching, present novel process is used to remove photoresist. At first, photoresist is removed by ozone ashing which is done in the same way as the comparative example. Then the wafer is immersed into mixed solution of sulfuric acid, ammonium fluoride and hydrogen peroxide at 120° C. for 10 min. The ratio of sulfuric acid+ammonium fluoride to hydrogen peroxide is 3:1 by volume. After this treatment, the wafer is inspected by SEM. It is obvious that photoresist and sidewall passivation after dry etching are removed completely by this single step without affecting Poly-Si and the bottom $SiO_2$ layer.

What is claimed is:

1. A process for removing sidewall residue from a wafer after dry etching comprising treating said wafer with a solution which comprises sulfuric acid and a fluorine containing compound, in the range of from 10:1 to 1000:1 parts by weight, effective for said sidewall residue removal wherein the etch rate of the wafer is less than 1 Å/min.

2. The process according to claim 1, the solution being in the range of from 100:1 to 700:1 parts by weight.

3. The process according to claim 1, the solution being in the range of from 300:1 to 500:1 parts by weight.

4. The process according to claim 1, wherein the fluorine containing compound is composed of fluorine ion and mono-charged cation, the types of cation include alkaline metal cation, ammonium cation and hydrogen ion.

5. The process according to claim 1, wherein the fluorine containing compound is hydrogen fluoride.

6. The process according to claim 1, wherein the fluorine-containing compound is ammonium fluoride.

7. A process for removing sidewall residue from a wafer after dry etching comprising treating said wafer with a solution which comprises sulfuric acid and ammonium fluoride, in the range of from 10:1 to 1000:1 parts by weight.

* * * * *